(12) United States Patent  (10) Patent No.: US 9,291,921 B2
Maeda  (45) Date of Patent: Mar. 22, 2016

(54) DETECTION APPARATUS, EXPOSURE APPARATUS, DEVICE FABRICATION METHOD AND FILTER TO REDUCE A DIFFERENCE BETWEEN DETECTED INTENSITY VALUES OF LIGHTS HAVING DIFFERENT WAVELENGTH RANGES

(75) Inventor: Hironori Maeda, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 772 days.

(21) Appl. No.: 13/478,363

(22) Filed: May 23, 2012

(65) Prior Publication Data

US 2012/0307226 A1 Dec. 6, 2012

(30) Foreign Application Priority Data

Jun. 1, 2011 (JP) ................................. 2011-123586

(51) Int. Cl.
*G03F 9/00* (2006.01)

(52) U.S. Cl.
CPC ............ *G03F 9/7088* (2013.01); *G03F 9/7065* (2013.01); *G03F 9/7069* (2013.01)

(58) Field of Classification Search
CPC ..... G06F 7/70633; G06F 9/00; G06F 9/7065; G06F 9/7069; G06F 9/7088; G06F 9/7092; G02B 26/00; G02B 26/02; G02B 5/20; G02B 5/204; G02B 5/22; G02B 5/208
See application file for complete search history.

(56) References Cited

U.S. PATENT DOCUMENTS

| | | | |
|---|---|---|---|
| 2002/0109825 A1 | 8/2002 | Gui et al. | |
| 2003/0202176 A1 | 10/2003 | Ohta | |
| 2005/0027166 A1* | 2/2005 | Matsumoto et al. | 600/162 |
| 2008/0049226 A1* | 2/2008 | Mieher et al. | 356/401 |
| 2010/0233600 A1* | 9/2010 | Den Boef et al. | 430/30 |
| 2011/0033790 A1 | 2/2011 | Mishima | |

FOREIGN PATENT DOCUMENTS

| | | |
|---|---|---|
| JP | 3225815 A | 10/1991 |
| JP | 7086126 A | 3/1995 |
| JP | 9160092 A | 6/1997 |
| JP | 10010483 A | 1/1998 |
| JP | 2002-280299 A | 9/2002 |
| JP | 2003322563 A | 11/2003 |
| JP | 2004271460 A | 9/2004 |
| JP | 2005156343 A | 6/2005 |
| JP | 2008155457 A | 7/2008 |

(Continued)

*Primary Examiner* — Peter B Kim
*Assistant Examiner* — Michelle Iacoletti
(74) *Attorney, Agent, or Firm* — Rossi, Kimms & McDowell LLP

(57) ABSTRACT

The present invention provides a detection apparatus which detects an object to be detected, the apparatus including an illumination system configured to illuminate the object with light containing a first wavelength range and a second wavelength range different from the first wavelength range, a detector configured to detect light from the object illuminated by the illumination system, and an optical member configured to set a transmittance for light in the first wavelength range and a transmittance for light in the second wavelength range to be different from each other, thereby reducing a difference between an intensity value of the light which has the first wavelength range and is detected by the detector and an intensity value of the light which has the second wavelength range and is detected by the detector.

16 Claims, 11 Drawing Sheets

(56) References Cited

FOREIGN PATENT DOCUMENTS

| | | | |
|---|---|---|---|
| JP | 2009239077 A | 10/2009 | |
| JP | 2010170265 A | 8/2010 | |
| JP | 2011-040549 A | 2/2011 | |
| JP | 2011064637 A | 3/2011 | |

* cited by examiner

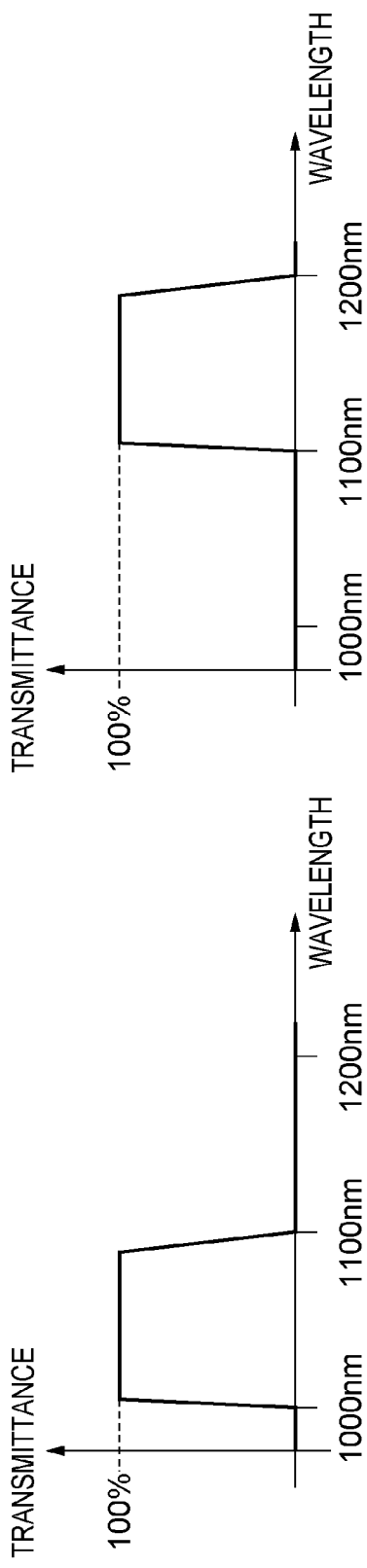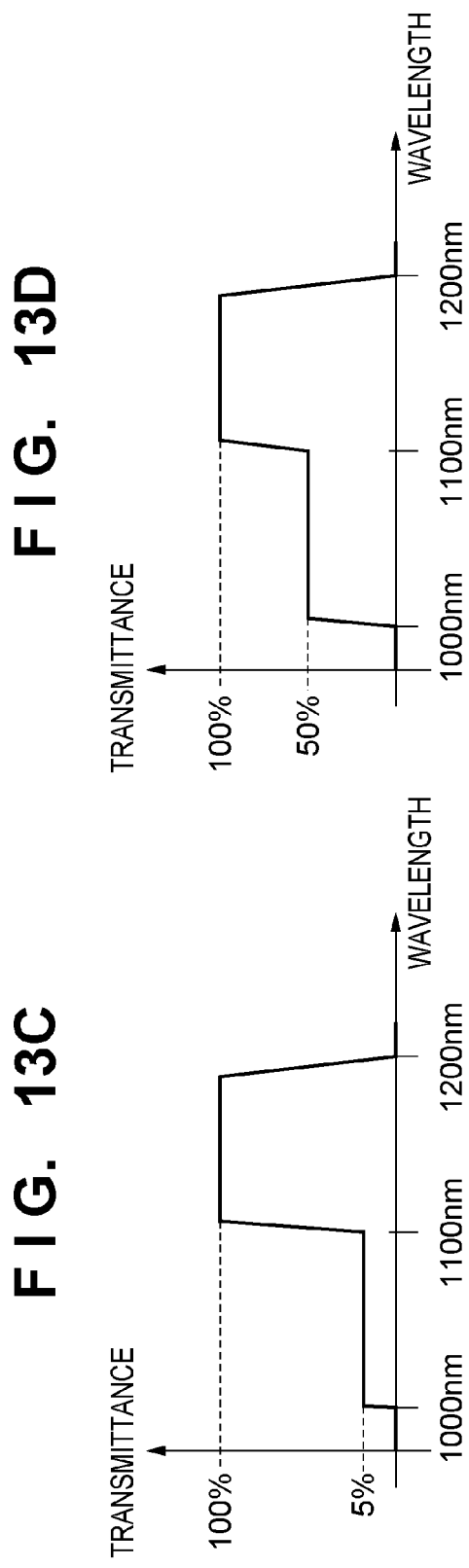

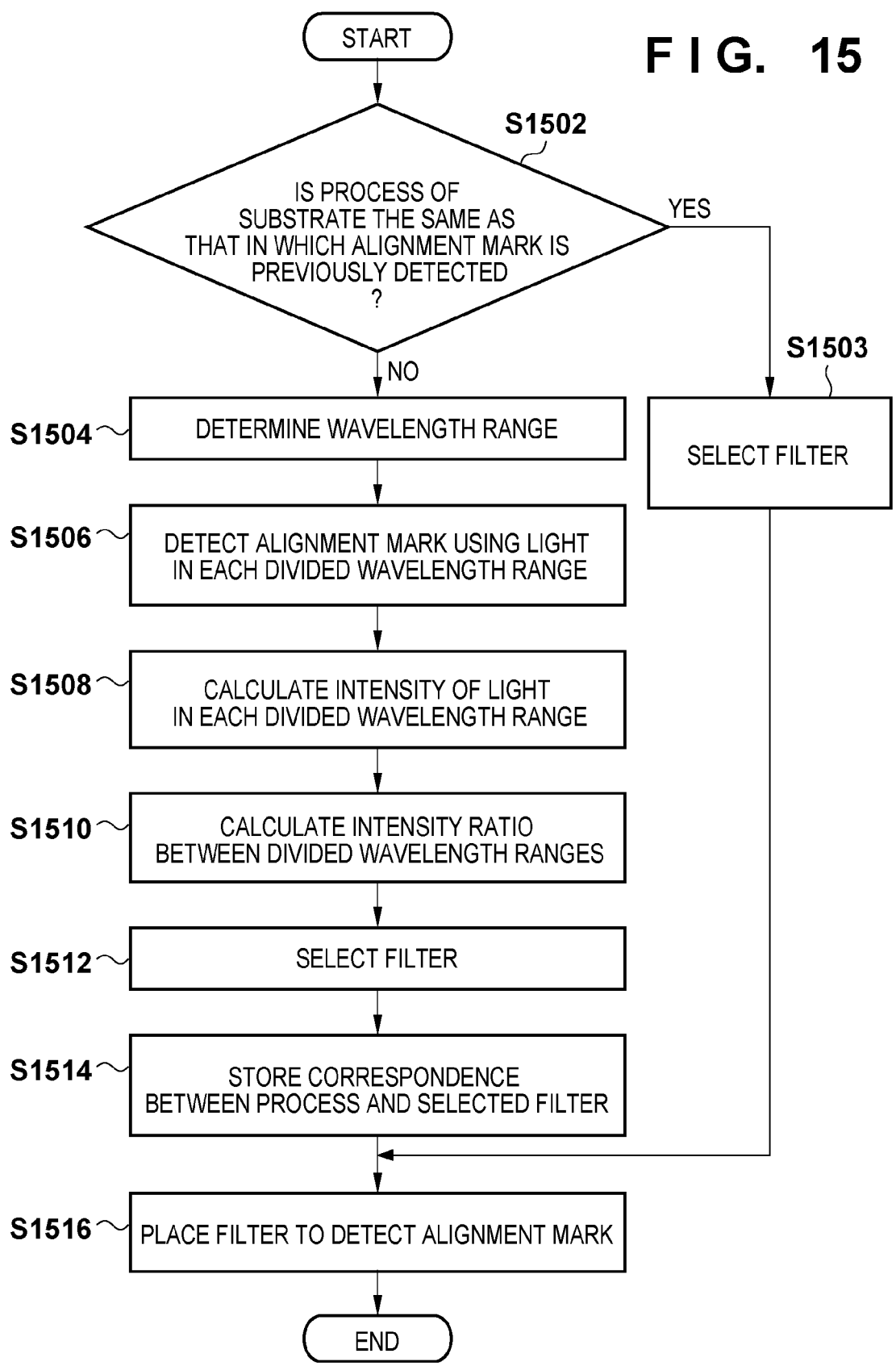

DETECTION APPARATUS, EXPOSURE APPARATUS, DEVICE FABRICATION METHOD AND FILTER TO REDUCE A DIFFERENCE BETWEEN DETECTED INTENSITY VALUES OF LIGHTS HAVING DIFFERENT WAVELENGTH RANGES

BACKGROUND OF THE INVENTION

1. Field of the Invention

The present invention relates to a detection apparatus which detects the position of an object to be detected, an exposure apparatus, a device fabrication method, and a filter.

2. Description of the Related Art

An exposure apparatus which projects and transfers the pattern of a reticle (mask) onto a substrate such as a wafer by a projection optical system is employed to fabricate a device (for example, a semiconductor device, a liquid crystal display device, or a thin film magnetic head) using a photolithography technique.

In recent years, an exposure apparatus is required to fabricate not only an IC chip such as a memory or logic device but also a special device (a stacked device using a through-hole via process) such as a MEMS or CMOS image sensor (CIS). The fabrication of such a special device requires only a lower feature size resolution and overlay accuracy but requires a larger depth of focus than in the fabrication of the conventional IC chip.

Also, in fabricating a special device, a special process of exposing the front side of a substrate (for example, an Si wafer) is performed based on the positions of alignment marks formed on the back side of the substrate. This process is necessary to form, for example, a through-hole via from the front side of the substrate to electrically connect the front side of the substrate to the circuit on the back side of the substrate.

To detect alignment marks on the back side of a substrate, Japanese Patent Laid-Open No. 2002-280299 proposes a technique of providing an alignment detection system on the back side of the substrate (on the substrate chuck side). However, note that when an alignment detection system is provided on the back side of a substrate, only an alignment mark formed in the detection region of the alignment detection system can be detected, and that formed at an arbitrary position on the substrate cannot be detected. In addition, the alignment detection system of the exposure apparatus is required not only to detect alignment marks on the back side of a substrate but also to detect those on the front side of the substrate.

Under the circumstance, a technique of detecting an alignment mark on the back side of a substrate from the front side of the substrate using infrared light (light having a wavelength of 1,000 nm or more) having transparency for the substrate is available. In this technique, the alignment mark on the back side of the substrate is detected using infrared light, and that on the front side of the substrate is detected using light (visible light) having wavelengths shorter than infrared light.

Unfortunately, because the alignment marks on both the front and back sides of the substrate are detected, the use of light in a wide wavelength range from visible light to infrared light poses a problem due to factors associated with the wavelength dependence of the sensitivity of an image sensor which senses an image of the alignment mark. The wavelength dependence of the sensitivity of the image sensor is high especially in the wavelength range of infrared light. Therefore, even if infrared light in a wide wavelength range is used to reduce interference fringes in a detection signal, the difference in sensitivity of the image sensor to this infrared light between different wavelength ranges is large, so the intensity of infrared light in a certain wavelength range is high, thus degrading the effect of reducing the interference fringes in the detection signal. When the interference fringes in the detection signal cannot be sufficiently reduced, the waveform of the detection signal deteriorates, thus making it impossible to accurately detect the alignment mark (its position).

Furthermore, the inventor of the present invention conducted a close examination, and concluded that the spectral characteristics of the image sensor for infrared light in a wide wavelength range are influenced not only by the wavelength dependence of the sensitivity of the image sensor but also by the process of a substrate having alignment marks formed on it. For example, it is often the case that the sensitivity of the image sensor to infrared light in a wide wavelength range is uniform in a certain process but is not uniform in a different process, thus making it impossible to sufficiently reduce interference fringes in a detection signal.

SUMMARY OF THE INVENTION

The present invention provides a technique which can accurately detect the position of an object to be detected (for example, marks formed on the front and back surfaces of a substrate).

According to one aspect of the present invention, there is provided a detection apparatus which detects an object to be detected, the apparatus including an illumination system configured to illuminate the object with light containing a first wavelength range and a second wavelength range different from the first wavelength range, a detector configured to detect light from the object illuminated by the illumination system, and an optical member configured to set a transmittance for light in the first wavelength range and a transmittance for light in the second wavelength range to be different from each other, thereby reducing a difference between an intensity value of the light which has the first wavelength range and is detected by the detector and an intensity value of the light which has the second wavelength range and is detected by the detector.

Further features of the present invention will become apparent from the following description of exemplary embodiments with reference to the attached drawings.

BRIEF DESCRIPTION OF THE DRAWINGS

FIGS. 13A to 13D are graphs each showing the transmittance of a filter used to detect the alignment mark formed on the back surface of the substrate.

FIG. 15 is a flowchart for explaining a detection process by the substrate alignment detection system.

DESCRIPTION OF THE EMBODIMENTS

Figure 1:
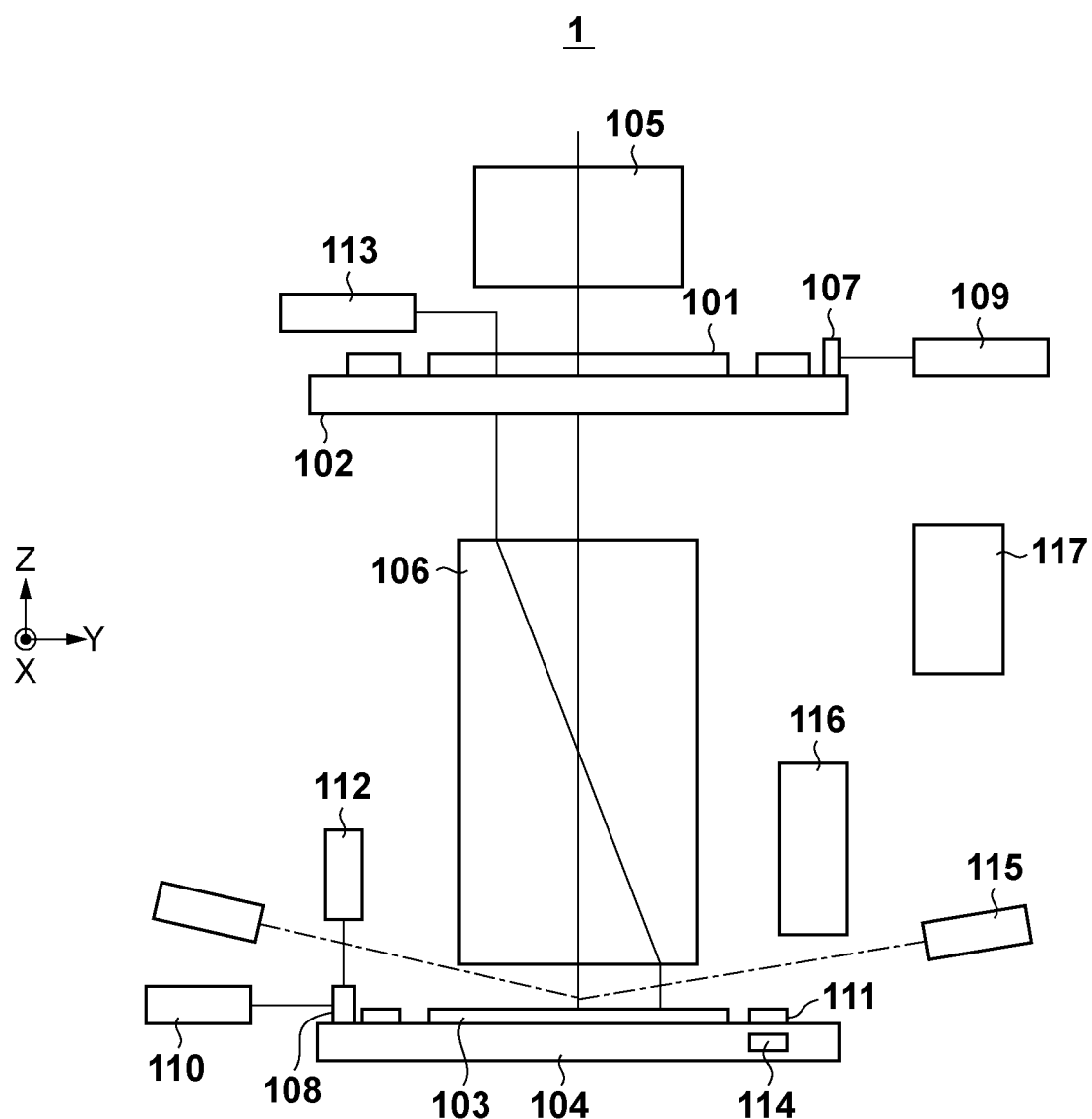
FIG. 1 is a schematic view showing the configuration of an exposure apparatus according to an aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the configuration of an exposure apparatus 1 according to an aspect of the present invention. The exposure apparatus 1 includes a reticle stage 102 which holds a reticle 101, a substrate stage 104 which holds a substrate 103, and an illumination optical system 105 which illuminates the reticle 101 held by the reticle stage 102. The exposure apparatus 1 also includes a projection optical system 106 which projects the pattern (its image) of the reticle 101 onto the substrate 103 held by the substrate stage 104, and a control unit 117 which systematically controls the operation of the overall exposure apparatus 1.

In this embodiment, the exposure apparatus 1 is a scanning exposure apparatus (scanner) which transfers the pattern of the reticle 101 onto the substrate 103 while synchronously scanning them (that is, by the step-and-scan scheme). However, the exposure apparatus 1 may be an exposure apparatus (stepper) which transfers the pattern of the reticle 101 onto the substrate 103 while the reticle 101 is fixed (that is, by the step-and-repeat scheme).

In the following description, a direction coinciding with the optical axis of the projection optical system 106 is defined as the Z-direction, the scanning direction of the reticle 101 and substrate 103 within a plane perpendicular to the Z-direction is defined as the Y-direction, and a direction (non-scanning direction) perpendicular to the Z- and Y-directions is defined as the X-direction. Also, rotation directions about the X-, Y-, and Z-axes are defined as the θX-, θY-, and θZ-directions, respectively.

The reticle stage 102 can move within a plane perpendicular to the optical axis of the projection optical system 106, that is, two-dimensionally move within the X-Y plane, and can rotate in the θZ-direction. However, the reticle stage 102 is driven about one or six axes by a driving device such as a linear motor.

A mirror 107 is placed on the reticle stage 102, and a laser interferometer 109 is placed at a position opposed to the mirror 107. The two-dimensional position and angle of rotation of the reticle stage 102 are measured in real time by the laser interferometer 109, and the measurement results are output to the control unit 117. The control unit 117 controls the driving device based on the measurement results obtained by the laser interferometer 109 to position the reticle 101 held by the reticle stage 102.

The projection optical system 106 includes a plurality of optical elements, and projects the pattern of the reticle 101 onto the substrate 103 at a predetermined projection magnification β. In this embodiment, the projection optical system 106 is a reduction optical system having a projection magnification β of, for example, ¼ or ⅕.

The substrate stage 104 includes a Z stage which holds the substrate 103 through a chuck, an X-Y stage which supports the Z stage, and a base which supports the X-Y stage. The substrate stage 104 is driven by a driving device such as a linear motor.

A mirror 108 is placed on the substrate stage 104, and laser interferometers 110 and 112 are placed at positions opposed to the mirror 108. The position of the substrate stage 104 in the X-, Y-, and θZ-directions is measured in real time by the laser interferometer 110, and the measurement result is output to the control unit 117. Similarly, the position of the substrate stage 104 in the Z-direction and that of the substrate stage 104 in the θX- and θY-directions are measured in real time by the laser interferometer 112, and the measurement results are output to the control unit 117. The control unit 117 controls the driving device based on the measurement results obtained by the laser interferometers 110 and 112 to position the substrate 103 held by the substrate stage 104.

A reticle alignment detection system 113 is placed near the reticle stage 102. The reticle alignment detection system 113 detects a reticle reference mark on the reticle 101 held by the reticle stage 102, and a reference mark MK1 on a stage reference plate 111 placed on the substrate stage 104 through the projection optical system 106.

The reticle alignment detection system 113 uses the same light source as that used to actually expose the substrate 103 to illuminate the reticle reference mark on the reticle 101, and the reference mark MK1 through the projection optical system 106. Also, the reticle alignment detection system 113 uses an image sensor (for example, a photoelectric conversion device such as a CCD camera) to detect light beams reflected by the reticle reference mark and reference mark MK1. The reticle 101 and substrate 103 are aligned based on detection signals from this image sensor. At this time, the positions and focuses of the reticle reference mark on the reticle 101 and the reference mark MK1 on the stage reference plate 111 are matched, thereby appropriately setting the relative positional relationship (X, Y, Z) between the reticle 101 and the substrate 103.

A reticle alignment detection system 114 is placed on the substrate stage 104. The reticle alignment detection system 114 is a transmissive detection system, which is used when the reference mark MK1 is a transmissive mark. The reticle alignment detection system 114 uses the same light source as that used to actually expose the substrate 103 to illuminate the reticle reference mark on the reticle 101 and the reference mark MK1, and uses a light amount sensor to detect light beams transmitted through these marks. At this time, the reticle alignment detection system 114 detects the amount of transmitted light while driving the substrate stage 104 in the X- (or Y-) and Z-directions. This makes it possible to match the positions and focuses of the reticle reference mark on the reticle 101 and the reference mark MK1 on the stage reference plate 111.

In this manner, either of the reticle alignment detection systems 113 and 114 can be used to appropriately set the relative positional relationship (X, Y, Z) between the reticle 101 and the substrate 103.

Figure 2:
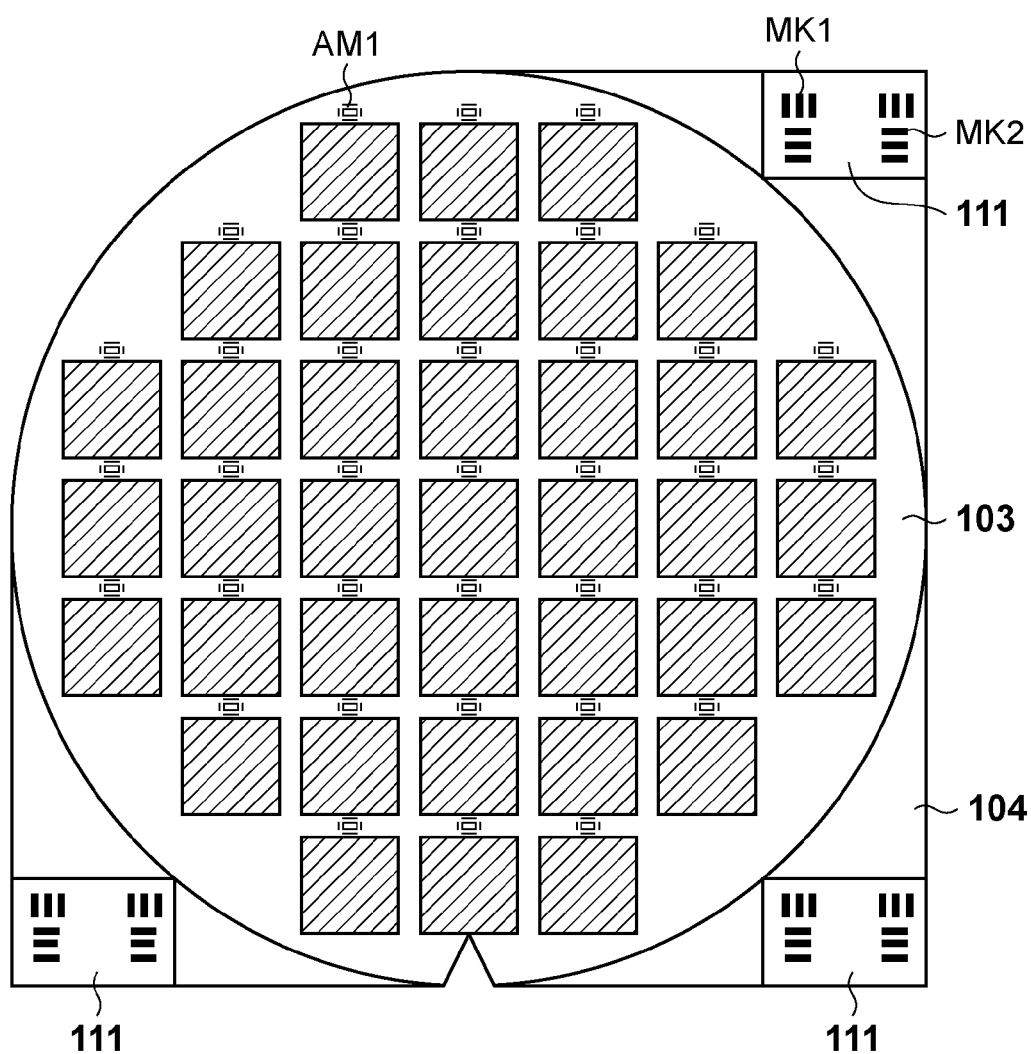
FIG. 2 is a view showing the configuration of a stage reference plate placed on a wafer stage.

The stage reference plate 111 is placed at each corner of the substrate stage 104 to be nearly flush with the surface of the substrate 103, as shown in FIG. 2. The stage reference plate 111 may be placed at one corner of the substrate stage 104 or placed at each of a plurality of corners of the substrate stage 104.

The stage reference plate 111 includes the reference mark MK1 detected by the reticle alignment detection system 113 or 114, and a reference mark MK2 detected by a substrate alignment detection system 116. The stage reference plate 111 may include pluralities of reference marks MK1 and MK2. Also, the positional relationship (in the X- and Y-directions) between the reference marks MK1 and MK2 is set to a predetermined positional relationship (that is, this positional relationship is known). Note that the reference marks MK1 and MK2 may be a common mark.

A focus detection system 115 includes a light-projecting system which projects light onto the front surface of the substrate 103, and a light-receiving system which receives the light reflected by the front surface of the substrate 103. The focus detection system 115 detects the focus of the substrate 103 (the position of the substrate 103 in the Z-direction), and outputs the detection result to the control unit 117. Based on the detection result obtained by the focus detection system 115, the control unit 117 controls the driving device which drives the substrate stage 104 to adjust the position, in the Z-direction, and the angle of tilt of the substrate 103 held by the substrate stage 104.

The substrate alignment detection system 116 includes an illumination system which illuminates an alignment mark AM1 on the substrate 103 and the reference mark MK2 on the stage reference plate 111, and an imaging system which forms images of the marks using light beams from the marks. The substrate alignment detection system 116 detects the positions of the alignment mark AM1 and reference mark MK2, and outputs the detection results to the control unit 117. Based on the detection results obtained by the substrate alignment detection system 116, the control unit 117 controls the driving device which drives the substrate stage 104 to adjust the position, in the X- and Y-directions, of the substrate 103 held by the substrate stage 104.

Note that it is a common practice to roughly classify the configurations of substrate alignment detection systems into two types: an off-axis detection system and a TTL-AA (Through The Lens Auto Alignment) detection system. The off-axis detection system optically detects an alignment mark on a substrate without using a projection optical system. The TTL-AA detection system detects an alignment mark on a substrate using light having a wavelength different from that of exposure light through a projection optical system. Although the substrate alignment detection system 116 is an off-axis detection system in this embodiment, it may be a TTL-AA detection system. When the substrate alignment detection system 116 is a TTL-AA detection system, it detects the alignment mark AM1 on the substrate 103 through the projection optical system 106, but has the same basic configuration as an off-axis detection system.

Figure 3:
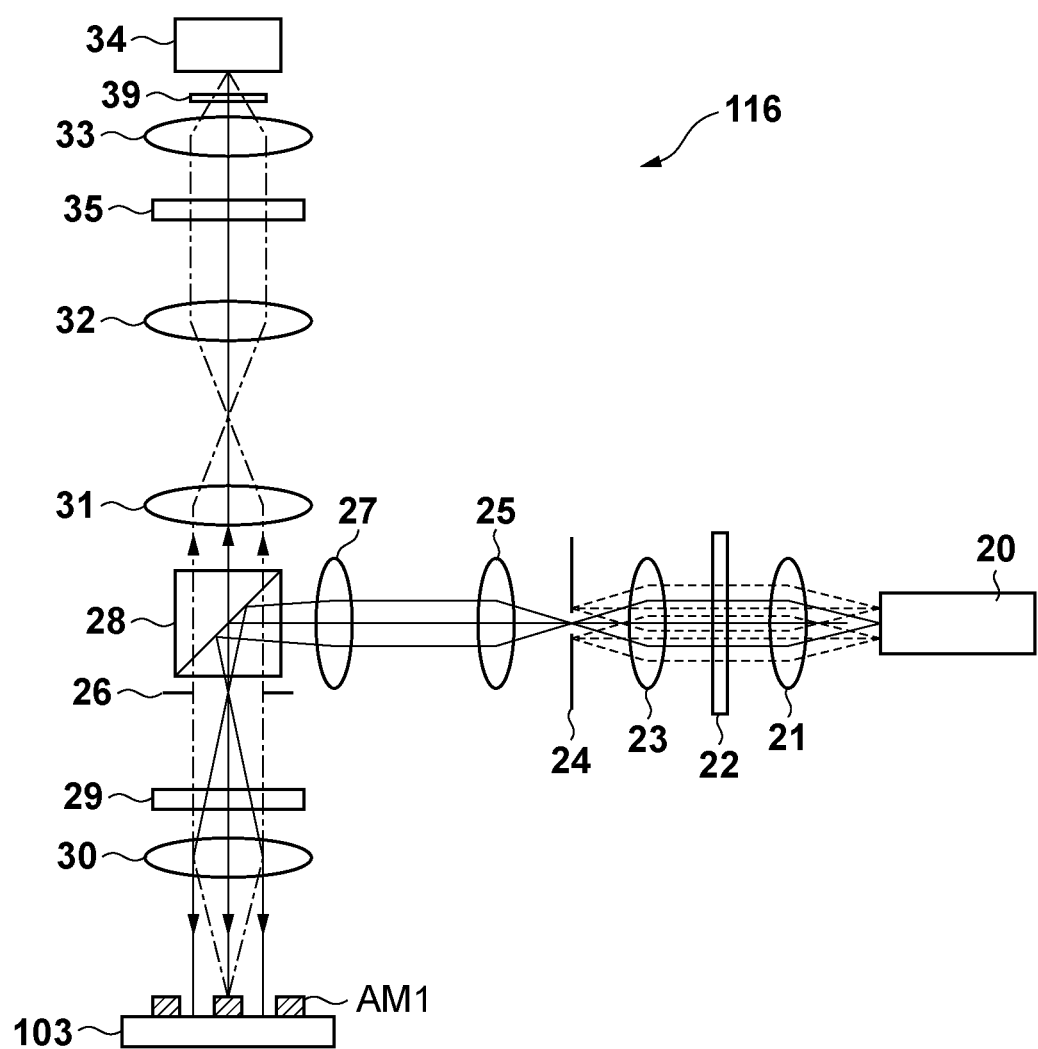
FIG. 3 is a schematic sectional view showing the detailed configuration of a substrate alignment detection system.

The substrate alignment detection system 116 will be described in more detail below with reference to FIG. 3. FIG. 3 is a schematic sectional view showing the detailed configuration of the substrate alignment detection system 116. The substrate alignment detection system 116 functions as a detection apparatus which detects an object to be detected (its position) such as each alignment mark AM1 or each reference mark MK2, as described above.

Figure 4:
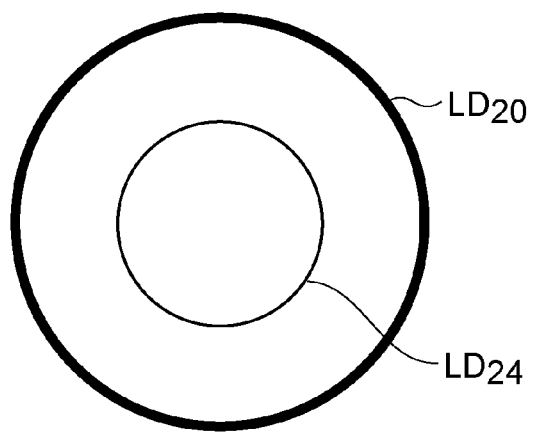
FIG. 4 is a view showing the relationship between the beam diameter in a light source and that in an aperture stop plate.

A light source 20 emits visible light which is not transmitted through the substrate 103, and infrared light transmitted through the substrate 103. Light emitted by the light source 20 passes through a first relay optical system 21, a wavelength filter plate 22, and a second relay optical system 23, and reaches an aperture stop plate 24 positioned on the pupil plane of the substrate alignment detection system 116 (an optical Fourier transform plane for the object plane). Note that a beam diameter $LD_{24}$ in the aperture stop plate 24 is sufficiently smaller than a beam diameter $LD_{20}$ in the light source 20, as shown in FIG. 4. FIG. 4 is a view showing the relationship between the beam diameter $LD_{20}$ in the light source 20 and the beam diameter $LD_{24}$ in the aperture stop plate 24.

Figure 5:
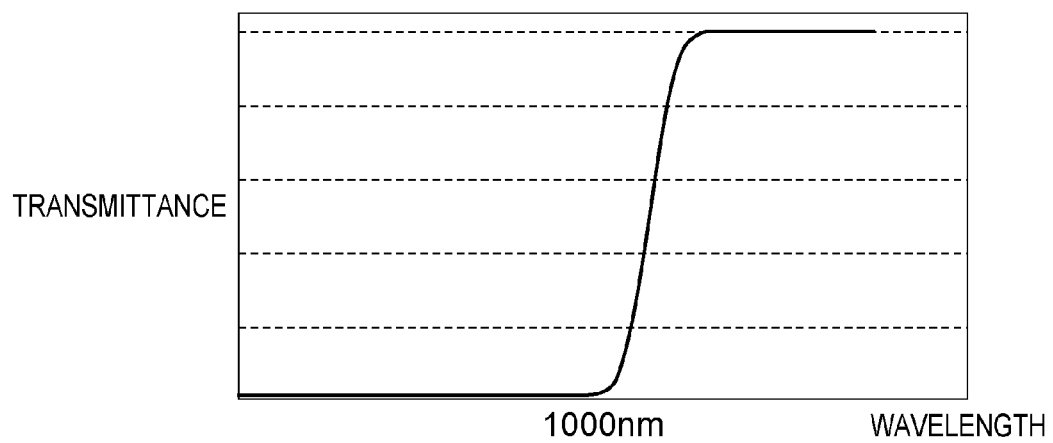
FIG. 5 is a graph schematically showing the transmittance as a function of the wavelength of light incident on an Si substrate.

A plurality of filters which transmit light beams in different wavelength ranges are arranged on the wavelength filter plate 22. One of the plurality of filters is selected and placed in the optical path of the substrate alignment detection system 116 under the control of the control unit 117. In other words, the wavelength filter plate 22 exchangeably holds a plurality of filters having different transmittances so as to insert or retract them into or from the optical path of the substrate alignment detection system 116. Note that the wavelength filter plate 22 has a configuration in which a new filter can be added. FIG. 5 is a graph schematically showing the transmittance as a function of the wavelength of light incident on an Si substrate serving as the substrate 103. The Si substrate has a transmittance which increases from a wavelength of about 1,000 nm, as shown in FIG. 5. For this reason, an alignment mark formed on the back surface of the Si substrate can be detected using light having a wavelength of 1,000 nm or more, and that formed on the front surface of the Si substrate can be detected using light having a wavelength less than 1,000 nm. Hence, in this embodiment, a visible light filter which transmits visible light, and an infrared light filter which transmits infrared light are arranged on the wavelength filter plate 22 and switched from one to the other, thereby illuminating the alignment mark with one of the visible light and the infrared light. Alternatively, instead of switching the filters arranged on the wavelength filter plate 22 from one to the other, a visible light source which emits visible light, and an infrared light source which emits infrared light may be provided and switched from one to the other, thereby illuminating the alignment mark with one of the visible light and the infrared light.

A plurality of aperture stops having different illumination coherence factors σ are arranged on the aperture stop plate 24. Under the control of the control unit 117, the aperture stop to be placed in the optical path of the substrate alignment detection system 116 is switched, thereby changing the illumination coherence factor σ of light which illuminates the alignment mark. Note that the aperture stop plate 24 has a configuration in which a new aperture stop can be added.

The light having reached the aperture stop plate 24 is guided to a polarizing beam splitter 28 through a first illumination system 25 and a second illumination system 27. Of the light guided to the polarizing beam splitter 28, S-polarized light perpendicular to the paper surface of FIG. 3 is reflected by the polarizing beam splitter 28, and is converted into circularly polarized light upon transmission through an NA stop 26 and a λ/4 plate 29. The light beam transmitted through the λ/4 plate 29 passes through an objective lens 30, and illuminates the alignment mark AM1 formed on the front surface of the substrate 103. Note that the NA of the NA stop 26 can be changed by changing the F-number of the NA stop 26 under the control of the control unit 117.

Light reflected, diffracted, and scattered by the alignment mark AM1 passes through the objective lens 30, is converted into P-polarized light parallel to the paper surface of FIG. 3 upon transmission through the λ/4 plate 29, and is transmitted through the polarizing beam splitter 28 through the NA stop 26. The light transmitted through the polarizing beam splitter 28 forms an image of the alignment mark AM1 on an image sensor 34 through a relay lens 31, a first imaging system 32, a coma aberration adjustment optical member 35, a second imaging system 33, and a wavelength shift difference adjustment optical member 39. The image sensor 34 is a detector which detects light from the alignment mark AM1. The image sensor 34 senses an image of the alignment mark AM1 and outputs a detection signal.

When the substrate alignment detection system 116 detects the alignment mark AM1 on the substrate 103, interference fringes are generated in the use of monochromatic light or light in a narrow wavelength range, because a resist (transparent layer) is applied (formed) on the alignment mark AM1. Therefore, a signal generated by the interference fringes is added to a detection signal (alignment signal) from the image sensor 34, thus making it impossible to accurately detect the alignment mark AM1 (its position). Hence, a light source which emits light in a wide wavelength range is generally used as the light source 20 to prevent a signal generated by the interference fringes from being added to a detection signal from the image sensor 34.

Also, to accurately detect the alignment mark AM1 on the substrate 103, an image of the alignment mark AM1 must be clearly sensed by the image sensor 34. In other words, the focal point (focus) of the substrate alignment detection system 116 must be matched with the alignment mark AM1. Hence, the substrate alignment detection system 116 generally includes an AF detection system (not shown) to detect the alignment mark AM1 based on the detection result obtained by the AF detection system, while the alignment mark AM1 is positioned on a best focus plane.

Figure 6:
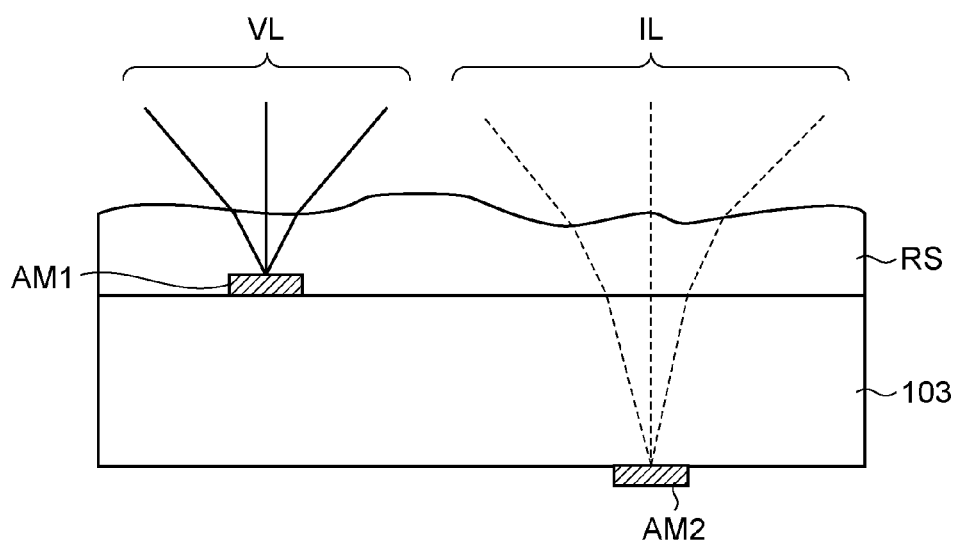
FIG. 6 is a view for explaining how the substrate alignment detection system detects alignment marks formed on the front and back surfaces of the substrate.

How the substrate alignment detection system 116 detects an alignment mark (an object to be detected) AM2 formed on the back surface of the substrate 103 will be explained next. FIG. 6 is a view showing how the substrate alignment detection system 116 detects the alignment mark AM1 formed on the front surface of the substrate 103, and the alignment mark AM2 formed on the back surface of the substrate 103. As described above, when the alignment mark AM1 formed on the front surface of the substrate 103 is to be detected, it is illuminated with visible light VL, as shown on the left side of FIG. 6. On the other hand, when the alignment mark AM2 formed on the back surface of the substrate 103 is to be detected, it is illuminated with infrared light IL, as shown on the right side of FIG. 6. Note that the front surface of the substrate 103 is coated with a resist RS, and the front surface of the resist RS is not flat but has projections and recesses formed on it due, for example, to variations in coating.

Figure 7A:
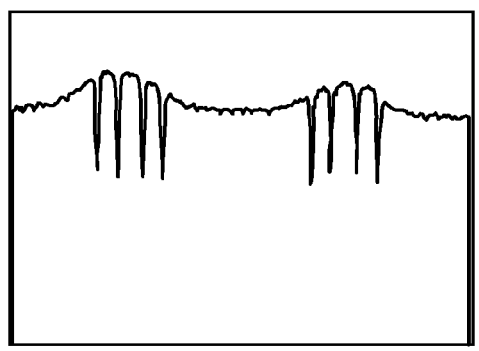
FIGS. 7A and 7B are charts illustrating examples of detection signals obtained by sensing images of the alignment mark.

For example, when the alignment mark AM1 formed on the front surface of the substrate 103 is detected using visible light in a narrow wavelength range (for example, visible light with a wavelength width of 30 nm in the wavelength range of, for example, 550 nm to 580 nm), a detection signal as shown in FIG. 7A is obtained. Referring to FIG. 7A, interference fringes are generated due to the influence of the projections and recesses on the front surface of the resist RS, and the alignment mark AM1 (its position) cannot be accurately detected from such a detection signal, as described above.

Figure 7B:
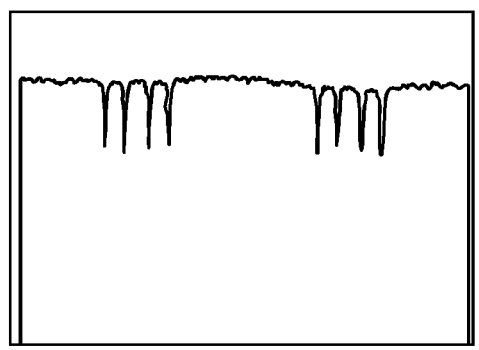

On the other hand, when the alignment mark AM1 formed on the front surface of the substrate 103 is detected using visible light in a wide wavelength range (for example, visible light with a wavelength width of 200 nm in the wavelength range of, for example, 500 nm to 700 nm), a detection signal as shown in FIG. 7B is obtained. Interference fringes have less influence on the detection signal shown in FIG. 7B than on the detection signal shown in FIG. 7A.

Figure 8:
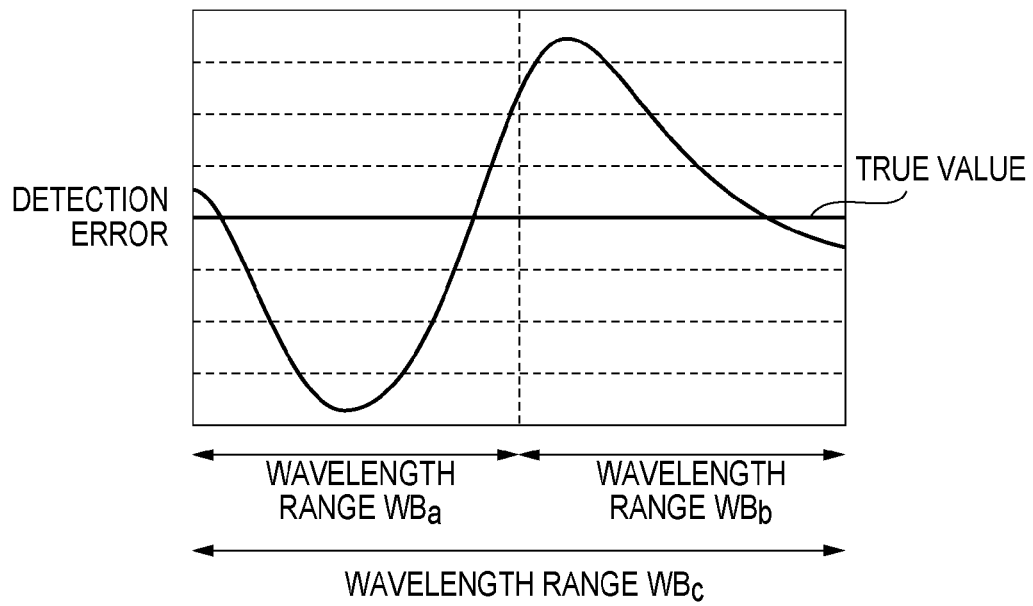
FIG. 8 is a graph showing the relationship between the wavelength range of light used to detect the alignment mark, and the detection error of the alignment mark.

FIG. 8 is a graph showing the relationship between the wavelength range of light used to detect the alignment mark AM1, and the detection error (measurement error) of the alignment mark AM1. Referring to FIG. 8, when light in a narrow wavelength range $WB_a$ is used, a detection error occurs in the negative direction from a true value as the detection error cannot be sufficiently averaged. Similarly, when light in a narrow wavelength range $WB_b$ is used, a detection error occurs in the positive direction from the true value as the detection error cannot be sufficiently averaged. In contrast, when light in a wide wavelength range $WB_c$ is used, the detection error is close to the true value as the detection error is averaged and the measurement error is reduced. Hence, in detecting the alignment mark, the use of light in a wide wavelength range is advantageous in reducing the influence of interference fringes to accurately detect the alignment mark. However, when the wavelength range is too wide, the contrast of the detection signal degrades due to an averaging effect. Therefore, it is necessary to widen the wavelength range within the range in which the degradation in contrast falls below a tolerance.

Figure 9:
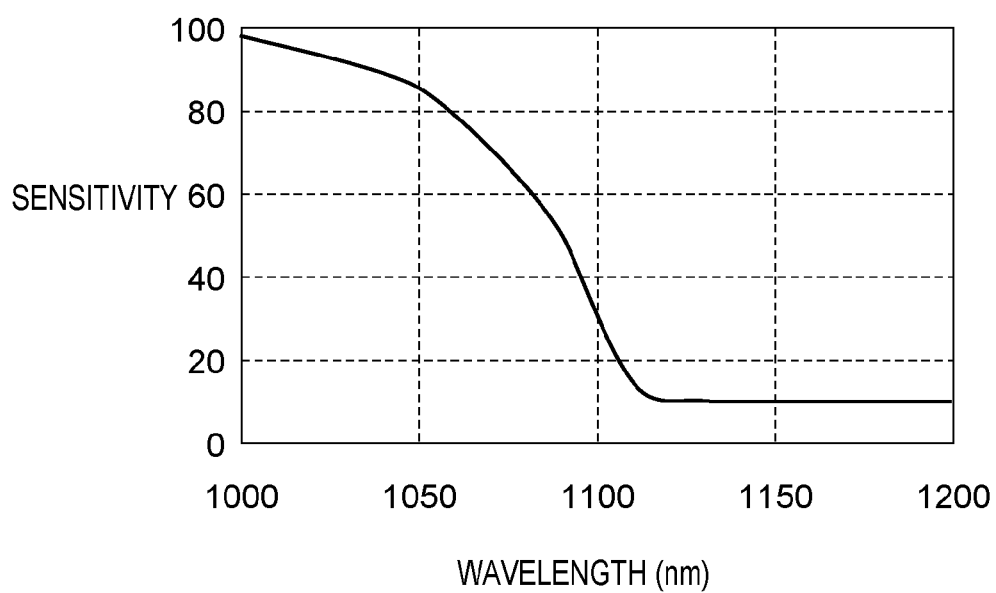
FIG. 9 is a graph showing the sensitivity of an image sensor to infrared light.

The case wherein the alignment mark AM2 formed on the back surface of the substrate 103 is detected using infrared light will be considered. The substrate 103 is assumed to have the transmittance shown in FIG. 5 as a function of the wavelength. Referring to FIG. 5, light having a wavelength of 1,000 nm or more is transmitted through the substrate 103, so infrared light having a wavelength of 1,000 nm or more is used to detect the alignment mark AM2. In general, the sensitivity of the image sensor 34 to infrared light (in the wavelength range of 1,000 nm to 1,200 nm) maximizes at a wavelength of 1,000 nm, and lowers as the wavelength comes close to 1,200 nm on the long wavelength side, as shown in FIG. 9.

Figure 10:
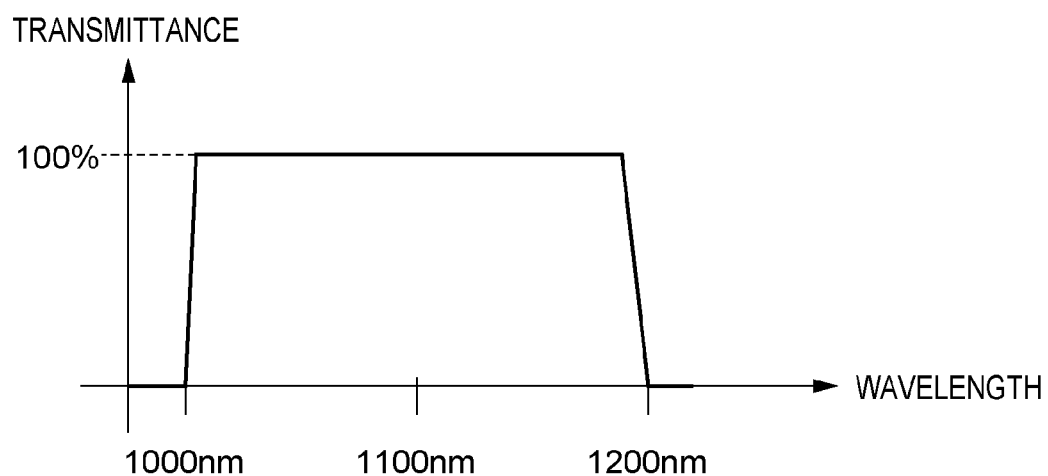
FIG. 10 is a graph showing the transmittance of a filter arranged on a wavelength filter plate.

When the alignment mark AM2 formed on the back surface of the substrate 103 is detected using infrared light (infrared light in a narrow wavelength range) with a wavelength width of 30 nm in the wavelength range of, for example, 1,000 nm to 1,030 nm, interference fringes are generated, so a detection signal as shown in FIG. 7A is obtained. However, even if the alignment mark AM2 formed on the back surface of the substrate 103 is detected using infrared light (infrared light in a wide wavelength range) with a wavelength width of 200 nm in the wavelength range of, for example, 1,000 nm to 1,200 nm so as to reduce the influence of interference fringes, a detection signal as shown in FIG. 7A is obtained. At this time, a filter having a transmittance of nearly 100% in the wavelength range of 1,000 nm to 1,200 nm, as shown in FIG. 10, is selected from the plurality of filters arranged on the wavelength filter plate 22, and this filter is placed in the optical path of the substrate alignment detection system 116.

In this manner, when the alignment mark AM2 formed on the back surface of the substrate 103 is detected, a detection signal as shown in FIG. 7A is obtained despite the use of infrared light in a wide wavelength range. This occurs because the sensitivity of the image sensor 34 to infrared light (in the wavelength range of 1,000 nm to 1,200 nm) lowers as the wavelength comes close to the long wavelength side, as shown in FIG. 9. Referring to FIG. 9, the sensitivity of the image sensor 34 is lower in the wavelength range of 1,100 nm to 1,200 nm than in the wavelength range of 1,000 nm to 1,050 nm. Therefore, even if infrared light in the wide wavelength range of 1,000 nm to 1,200 is used, only infrared light in the narrow wavelength range of substantially about 1,000 nm to 1,050 nm appears in the detection signal. In other words, even if infrared light in a wide wavelength range is used, only infrared light in a narrow wavelength range contributes to the detection signal because the sensitivity of the image sensor 34 to the wavelength range of infrared light is not uniform, so the influence of interference fringes cannot be sufficiently reduced.

Hence, in this embodiment, the transmittance in the optical path of the substrate alignment detection system 116 for light in a first wavelength range, and that in the optical path of the substrate alignment detection system 116 for light in a second wavelength range different from the first wavelength range are set different from each other in the wavelength range of infrared light, as will be described hereinafter. This reduces the difference between the intensity value (detected value) of light which has the first wavelength range and forms an image of the alignment mark AM2 detected by the image sensor 34, and that of light which has the second wavelength range and forms an image of the alignment mark AM2 detected by the image sensor 34. In other words, in this embodiment, the intensity value of light which forms an image of the alignment mark AM2 detected by the image sensor 34 is uniformed in the wavelength range of infrared light.

Figure 11:
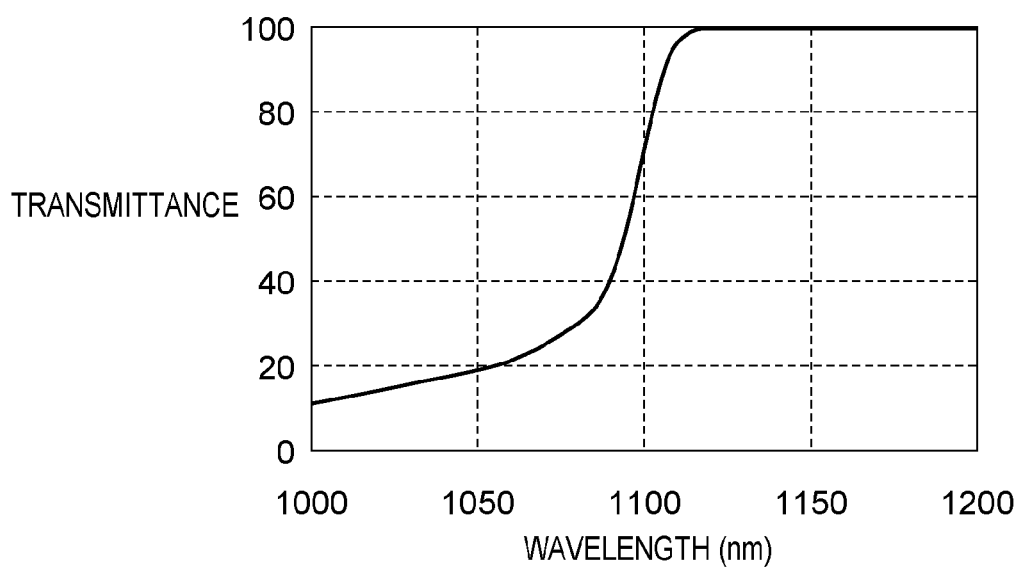
FIG. 11 is a graph showing the transmittance of a filter used to detect the alignment mark formed on the back surface of the substrate.

More specifically, a filter (optical member) having a transmittance (transmission intensity) which varies in each individual wavelength range is used in the infrared light wavelength range of 1,000 nm to 1,200 nm. A filter having a transmittance inversely proportional to the sensitivity of the image sensor 34 (see FIG. 9), for example, is used, as shown in FIG. 11. Referring to FIG. 11, this filter has a transmittance that is relatively low in the wavelength range of 1,000 nm to 1,100 nm (on the short wavelength side) and is relatively high in the wavelength range of 1,100 nm to 1,200 nm (on the long wavelength side). In other words, this filter has a transmittance that reduces to zero the difference between the intensity of light which is on the short wavelength side and forms an image of the alignment mark AM2 sensed by the image sensor 34, and that of light which is on the long wavelength side and forms an image of the alignment mark AM2 sensed by the image sensor 34. Such a filter is arranged on the wavelength filter plate 22, and placed in the optical path of the substrate alignment detection system 116 in detecting the alignment mark AM2.

The case wherein a filter having a transmittance as shown in FIG. 11 is placed in the optical path of the substrate alignment detection system 116 to detect the alignment mark AM2 formed on the back surface of the substrate 103 will be described. The filter having the transmittance shown in FIG. 11 has a relatively low transmittance in the wavelength range of 1,000 nm to 1,100 nm and has a relatively high transmittance in the wavelength range of 1,100 nm to 1,200 nm, as described above. When the wavelength dependence of the sensitivity of the image sensor 34, shown in FIG. 9, is additionally taken into consideration herein, the intensity of light which forms an image of the alignment mark AM2 sensed by the image sensor 34 becomes uniform in the wavelength range of 1,000 nm to 1,200 nm. Therefore, as long as the alignment mark AM2 is detected using infrared light which has the wavelength range of 1,000 nm to 1,200 nm and has passed through the filter having the transmittance shown in FIG. 11, a detection signal having sufficiently reduced interference fringes, as shown in FIG. 7B, can be obtained.

In this manner, in this embodiment, a filter having a transmittance (transmittance distribution) inversely proportional to the wavelength dependence of the sensitivity of the image sensor 34, shown in FIG. 9, is used in the infrared light wavelength range of 1,000 nm to 1,200 nm. In other words, the transmittance of the substrate alignment detection system 116 for light in the wavelength range of 1,000 nm to 1,100 nm, and that of the substrate alignment detection system 116 for light in the wavelength range of 1,100 nm to 1,200 nm are set different from each other in the wavelength range of 1,000 nm to 1,200 nm. This makes it possible to uniform the spectral characteristics of the substrate alignment detection system 116 in the wavelength range of 1,000 nm to 1,200 nm to obtain a detection signal in which the influence of interference fringes is reduced. This, in turn, makes it possible to accurately detect the alignment mark AM2 (its position).

On the other hand, in the related art technique, the alignment mark AM2 is detected using infrared light which has the wavelength range of 1,000 nm to 1,200 nm and has passed through the filter having the transmittance shown in FIG. 10, as described above. In this case, only a detection signal as shown in FIG. 7A can be obtained due to factors associated with the wavelength dependence of the sensitivity of the image sensor 34.

Although a filter is used as an optical member having a transmittance that varies in each individual wavelength range in the infrared light wavelength range of 1,000 nm to 1,200 nm in this embodiment, an optical member other than a filter may be used as long as it has such a transmittance. Alternatively, the amount of light in each wavelength range may be controlled on the light source side. The amount of light in each wavelength range can be controlled by adjusting, for example, the amount of light emitted by each of a plurality of light sources (optical units) which emit light beams in different wavelength ranges (that is, the amount of light beams which have different wavelength ranges and are incident on the substrate alignment detection system). Again, when a halogen lamp is used as the light source, the amount of light in each wavelength range can be controlled by adjusting a voltage (supply voltage) supplied to the halogen lamp. A halogen lamp emits light with an intensity that is higher on the short wavelength side than on the long wavelength side when the supply voltage is high. Therefore, the supply voltage need only be set high to allow the halogen lamp to emit light with a transmittance that is higher on the short wavelength side than on the long wavelength side. On the other hand, the supply voltage need only be set low to allow the halogen lamp to emit light with a transmittance that is lower on the short wavelength side than on the long wavelength side.

Although the infrared light wavelength range of 1,000 nm to 1,200 nm has been taken as an example in this embodiment, the wavelength range is not limited, and may be 1,050 nm to 1,200 nm or 1,100 nm to 1,250 nm as long as interference fringes can be sufficiently reduced. Also, although the wavelength dependence of the sensitivity of the image sensor in the infrared light wavelength range of 1,000 nm to 1,200 nm has been taken as an example in this embodiment, the present invention is also applicable to the wavelength dependence of the sensitivity of the image sensor in, for example, visible light wavelength range other than the infrared light wavelength range.

Figure 12A:
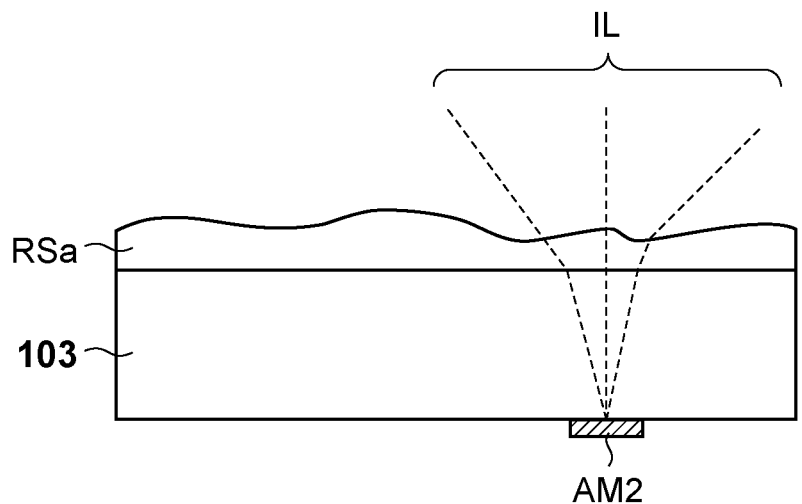
FIGS. 12A and 12B are graphs for explaining how the substrate alignment detection system detects the alignment mark formed on the back surface of the substrate.
Figure 12B:
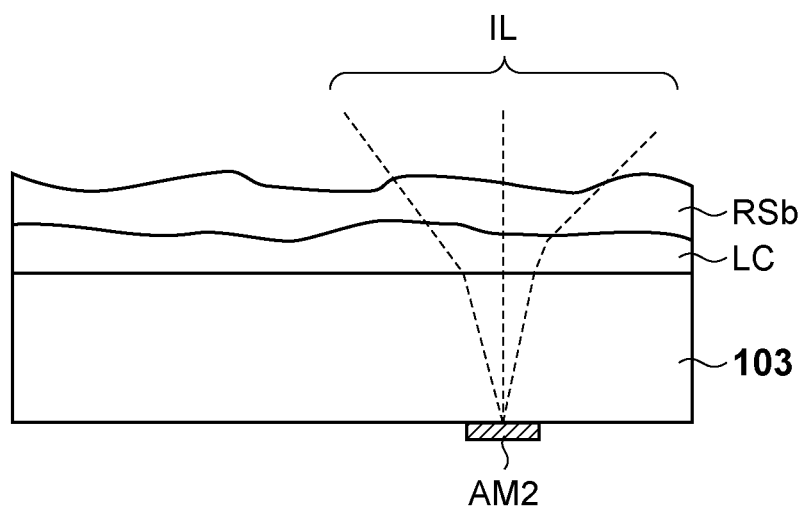

The influence that the process of the substrate 103 exerts on the detection signal will be described next. The case wherein a resist RSa is coated on the substrate 103, as shown in FIG. 12A, and that wherein an interlayer film LC and a resist RSb are coated on the substrate 103, as shown in FIG. 12B, will be considered. Referring to FIGS. 12A and 12B, the front surfaces of the resists RSa and RSb coated on the substrate 103 are not flat but have projections and recesses formed on them due, for example, to variations in coating, so interference fringes must be reduced using light in a wide wavelength range. The case wherein a filter having a transmittance of nearly 100% in the wavelength range of 1,000 nm to 1,200 nm, as shown in FIG. 10, is placed in the optical path of the substrate alignment detection system 116 will be considered for each of FIGS. 12A and 12B. In this case, when the alignment mark AM2 is detected using infrared light in the wavelength range of 1,000 nm to 1,200 nm, only a detection signal as shown in FIG. 7A can be obtained.

Hence, the case wherein a filter having a transmittance as shown in FIG. 11 is placed in the optical path of the substrate alignment detection system 116 to detect the alignment mark AM2 formed on the back surface of the substrate 103 will be considered for each of FIGS. 12A and 12B. In this case, as described above, a detection signal having sufficiently reduced interference fringes, as shown in FIG. 7B, is theoretically expected to be obtained, but a detection signal as shown in FIG. 7A is obtained in practice. In FIG. 6, the spectral characteristics of the process of the substrate 103 itself for the wavelength are nearly uniform, so the use of a filter (see FIG. 11) which inversely corrects the wavelength dependence of the sensitivity of the image sensor 34 makes it possible to uniform the spectral characteristics of the substrate alignment detection system 116. However, in FIGS. 12A and 12B, the spectral characteristics of the process of the substrate 103 itself for the wavelength are not uniform, so the use of a filter which inversely corrects the wavelength dependence of the sensitivity of the image sensor 34 is insufficient to uniform the spectral characteristics of the substrate alignment detection system 116. In such a case, the spectral characteristics of the substrate alignment detection system 116 must be uniformed by taking into consideration not only the wavelength dependence of the sensitivity of the image sensor 34 but also the spectral characteristics of the process of the substrate 103 itself for the wavelength.

How to uniform the spectral characteristics of the substrate alignment detection system 116 by taking into consideration not only the wavelength dependence of the sensitivity of the image sensor 34 but also the spectral characteristics of the process of the substrate 103 itself for the wavelength will be explained below.

The process of the substrate 103 shown in FIG. 12A will be considered. First, a filter having a transmittance as shown in FIG. 13A is placed in the optical path of the substrate alignment detection system 116 to detect the alignment mark AM2 formed on the back surface of the substrate 103 shown in FIG. 12A. The filter having the transmittance shown in FIG. 13A has a transmittance of nearly 100% in the wavelength range of 1,000 nm to 1,100 nm, and a transmittance of 0% in the wavelength range of 1,100 nm to 1,200 nm. In this case, infrared light which illuminates the alignment mark AM2 has the wavelength range of 1,000 nm to 1,100 nm, that is not sufficiently wide so a detection signal having non-reduced interference fringes, as shown in FIG. 7A, is obtained. At this time, light (detection signal) which forms an image of the alignment mark AM2 sensed by the image sensor 34 is assumed to have an intensity of 80%.

Then, a filter having a transmittance as shown in FIG. 13B is placed in the optical path of the substrate alignment detection system 116 to detect the alignment mark AM2 formed on the back surface of the substrate 103 shown in FIG. 12A. The filter having the transmittance shown in FIG. 13B has a transmittance of nearly 100% in the wavelength range of 1,100 nm to 1,200 nm, and a transmittance of 0% in the wavelength range of 1,000 nm to 1,100 nm. In this case, infrared light which illuminates the alignment mark AM2 has the wavelength range of 1,100 nm to 1,200 nm, that is not sufficiently wide so a detection signal having non-reduced interference fringes, as shown in FIG. 7A, is obtained. At this time, light which forms an image of the alignment mark AM2 sensed by the image sensor 34 is assumed to have an intensity of 4%. Note that except for the filter conditions, the conditions (the conditions, under which the alignment mark AM2 is detected, such as the voltage of the light source 20 and the storage time of the image sensor 34) which influence the detection signal (especially the intensity) remain the same.

In this manner, upon detection of the alignment mark AM2 using two filters having different transmittances in the wavelength range of infrared light, these filters generate a difference of 20 times in intensity of light (detection signal) which forms an image of the alignment mark AM2 sensed by the image sensor 34. This shows the difference in spectral characteristics of the substrate alignment detection system 116 between the wavelength range of 1,000 nm to 1,100 nm and that of 1,100 nm to 1,200 nm when the wavelength dependence of the sensitivity of the image sensor 34 and the spectral characteristics of the process of the substrate 103 itself for the wavelength are taken into consideration.

Accordingly, in this embodiment, the intensity ratio of 20 times in the wavelength range of 1,000 nm to 1,200 nm is corrected using a filter having a transmittance shown in FIG. 13C. The filter having the transmittance shown in FIG. 13C has a transmittance of nearly 100% in the wavelength range of 1,100 nm to 1,200 nm, and a transmittance of nearly 5% in the wavelength range of 1,000 nm to 1,100 nm. This means that the ratio between the transmittance in the wavelength range of 1,000 nm to 1,100 nm and that in the wavelength range of 1,100 nm to 1,200 nm is 1:20. In other words, the transmittance of the filter shown in FIG. 13C has a relationship inverse to the ratio between the intensity (80%) in the wavelength range of 1,000 nm to 1,100 nm and that (4%) in the wavelength range of 1,100 nm to 1,200 nm. A detection signal having sufficiently reduced interference fringes, as shown in FIG. 7B, can be obtained as long as the alignment mark AM2 is detected using infrared light which has the wavelength range of 1,000 nm to 1,200 nm and has passed through the filter having the transmittance shown in FIG. 13C.

The process of the substrate 103 shown in FIG. 12B will be considered. A filter having a transmittance as shown in FIG. 13C is placed in the optical path of the substrate alignment detection system 116 to detect the alignment mark AM2 formed on the back surface of the substrate 103 shown in FIG. 12B. In this case, a detection signal having non-reduced interference fringes, as shown in FIG. 7A, is obtained. This occurs because the spectral characteristics of the process of the substrate 103 for the wavelength are different in the process of the substrate 103 shown in FIG. 12B, unlike the process of the substrate 103 shown in FIG. 12A.

Hence, first, a filter having a transmittance as shown in FIG. 13A is placed in the optical path of the substrate alignment detection system 116 to detect the alignment mark AM2 formed on the back surface of the substrate 103 shown in FIG. 12B. In this case, infrared light which illuminates the alignment mark AM2 has the wavelength range of 1,000 nm to 1,100 nm, that is not sufficiently wide so a detection signal having non-reduced interference fringes, as shown in FIG. 7A, is obtained. At this time, light (detection signal) which forms an image of the alignment mark AM2 sensed by the image sensor 34 is assumed to have an intensity of 70%.

Then, a filter having a transmittance as shown in FIG. 13B is placed in the optical path of the substrate alignment detection system 116 to detect the alignment mark AM2 formed on the back surface of the substrate 103 shown in FIG. 12B. In this case, infrared light which illuminates the alignment mark AM2 has the wavelength range of 1,100 nm to 1,200 nm, that is not sufficiently wide so a detection signal having non-reduced interference fringes, as shown in FIG. 7A, is obtained. At this time, light which forms an image of the alignment mark AM2 sensed by the image sensor 34 is assumed to have an intensity of 35%. Note that except for the filter conditions, the conditions (the conditions, under which the alignment mark AM2 is detected, such as the voltage of the light source 20 and the storage time of the image sensor 34) which influence the detection signal (especially the intensity) remain the same.

In this manner, upon detection of the alignment mark AM2 using two filters having different transmittances in the wavelength range of infrared light, these filters generate a difference of two times in intensity of light (detection signal) which forms an image of the alignment mark AM2 sensed by the image sensor 34. This shows the difference in spectral characteristics of the substrate alignment detection system 116 between the wavelength range of 1,000 nm to 1,100 nm and that of 1,100 nm to 1,200 nm when the wavelength dependence of the sensitivity of the image sensor 34 and the spectral characteristics of the process of the substrate 103 itself for the wavelength are taken into consideration.

Accordingly, in this embodiment, the intensity ratio of two times in the wavelength range of 1,000 nm to 1,200 nm is corrected using a filter having a transmittance shown in FIG. 13D. The filter having the transmittance shown in FIG. 13D has a transmittance of nearly 100% in the wavelength range of 1,100 nm to 1,200 nm, and a transmittance of nearly 50% in the wavelength range of 1,000 nm to 1,100 nm. This means that the ratio between the transmittance in the wavelength range of 1,000 nm to 1,100 nm and that in the wavelength range of 1,100 nm to 1,200 nm is 1:2. In other words, the transmittance of the filter shown in FIG. 13D has a relationship inverse to the ratio between the intensity (70%) in the wavelength range of 1,000 nm to 1,100 nm and that (35%) in the wavelength range of 1,100 nm to 1,200 nm. A detection signal having sufficiently reduced interference fringes, as shown in FIG. 7B, can be obtained as long as the alignment mark AM2 is detected using infrared light which has the wavelength range of 1,000 nm to 1,200 nm and has passed through the filter having the transmittance shown in FIG. 13D.

Figure 14:
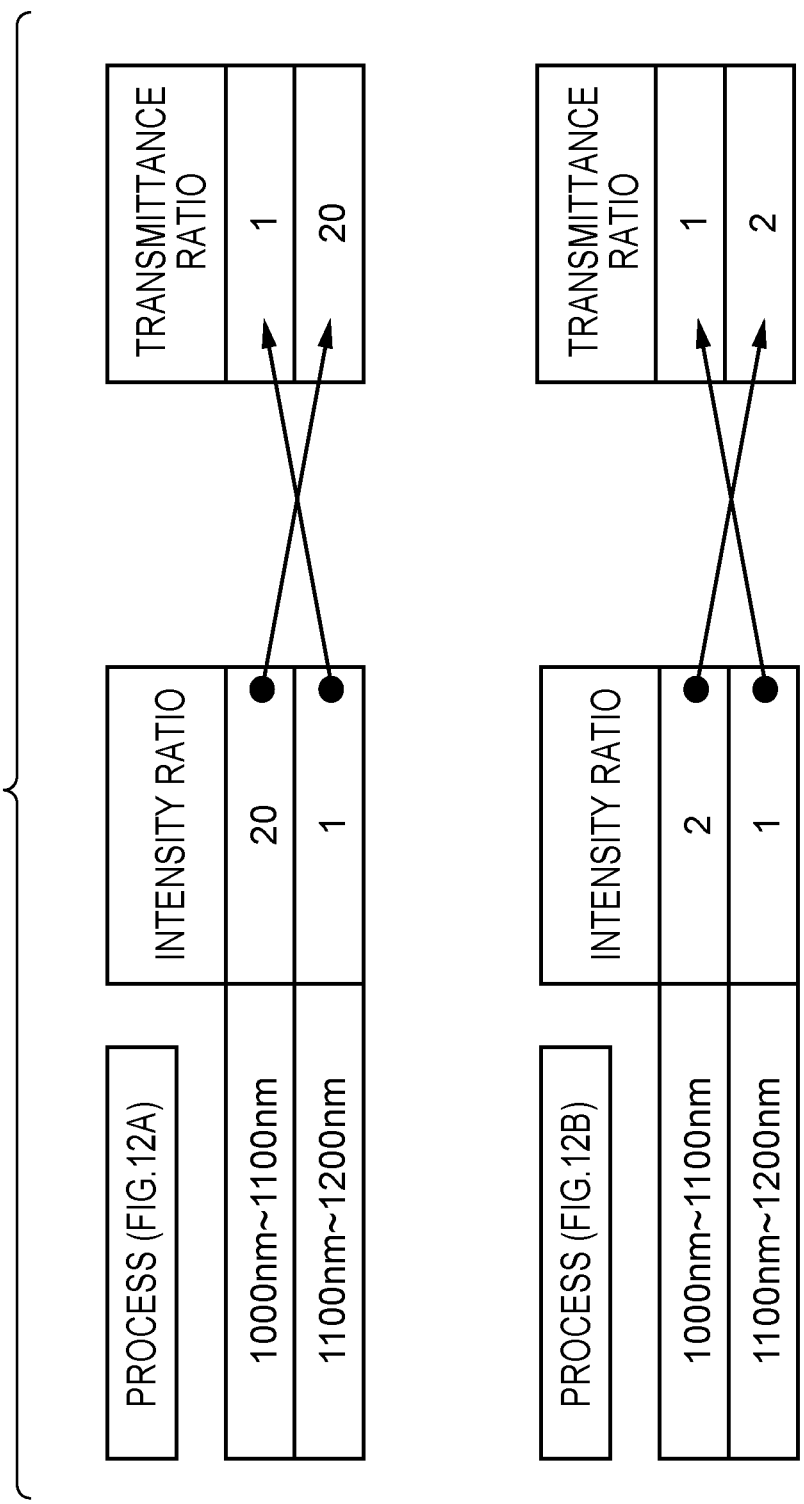
FIG. 14 is a table showing the relationship between the intensity of light which forms an image of the alignment mark sensed by the image sensor, and the transmittance of the filter.

FIG. 14 is a table showing the relationship between the intensity of light (detection signal) which forms an image of the alignment mark AM2 sensed by the image sensor 34, and the transmittance of the filter, in each of the processes of the substrate 103 shown in FIGS. 12A and 12B. As can be seen from FIG. 14, the transmittance ratio of the filter is inverse to the intensity ratio in the wavelength range of 1,000 nm to 1,100 nm and the wavelength range of 1,100 nm to 1,200 nm.

In this manner, in this embodiment, the spectral characteristics of the substrate alignment detection system 116 can be uniformed by taking into consideration not only the wavelength dependence of the sensitivity of the image sensor 34 but also the spectral characteristics of the process of the substrate 103 itself for the wavelength.

Note that this embodiment assumes that the filter having the transmittance shown in FIG. 13C and that having the transmittance shown in FIG. 13D are arranged on the wavelength filter plate 22 to switch them from one to the other in accordance with the process of the substrate 103. However, a filter having a transmittance for light in the wavelength range of 1,000 nm to 1,100 nm and that for light in the wavelength range of 1,100 nm to 1,200 nm at a ratio of 1:5 or 1:10 may be arranged on the wavelength filter plate 22.

Also, for example, a filter having a transmittance ratio corresponding to the intensity ratio between the wavelength range of 1,000 nm to 1,100 nm and the wavelength range of 1,100 nm to 1,200 nm is sometimes not arranged on the wavelength filter plate 22. The case wherein the intensity ratio between the wavelength range of 1,000 nm to 1,100 nm and the wavelength range of 1,100 nm to 1,200 nm is, for example, 6:1 will be considered. Then, assume that a filter having a transmittance for light in the wavelength range of 1,000 nm to 1,100 nm and that for light in the wavelength range of 1,100 nm to 1,200 nm at a ratio of 1:6 is not arranged on the wavelength filter plate 22. In such a case, a filter having a transmittance ratio closest to 1:6, for example, a transmittance ratio of 1:5 need only be selected from the plurality of filters arranged on the wavelength filter plate 22.

Also, when a filter optimum for the process of the substrate 103 is selected, the correspondence between the process of the substrate 103 and the selected filter may be stored in a storage unit (for example, a memory of the control unit 117). The optimum filter means herein a filter having a transmittance that reduces to zero the difference between the intensity of light which is on the short wavelength side and forms an image of the alignment mark AM2 sensed by the image sensor 34, and that of light which is on the long wavelength side and forms an image of the alignment mark AM2 sensed by the image sensor 34. Upon this operation, when the alignment mark AM2 formed on the back surface of the substrate 103 in the same process is to be detected, a filter to be placed in the optical path of the substrate alignment detection system 116 can be selected based on the correspondence stored in the storage unit. Note that the present invention is not limited to the case wherein a filter to be placed in the optical path of the substrate alignment detection system 116 is selected, and the correspondence between the process of the substrate 103 (that is, the intensity ratio in the wavelength range of infrared rays) and the optimum filter may be stored in the storage unit in advance.

Also, although the wavelength range of infrared light is divided into two wavelength ranges (two divided wavelength ranges): the wavelength range of 1,000 nm to 1,100 nm and the wavelength range of 1,100 nm to 1,200 nm in this embodiment, it may be divided into three or more wavelength ranges. The infrared light wavelength range of 1,000 nm to 1,200 nm may be divided into, for example, three divided wavelength ranges: the wavelength range of 1,000 nm to 1,060 nm, the wavelength range of 1,060 nm to 1,130 nm, and the wavelength range of 1,130 nm to 1,200 nm. A filter having a transmittance of nearly 100% in each divided wavelength range is placed in the optical path of the substrate alignment detection system 116 to detect the alignment mark AM2, thereby obtaining the intensity ratio among the three divided wavelength ranges. In this manner, the infrared light wavelength range may be divided into three or four wavelength ranges as long as the number of wavelength ranges (the number of divided wavelength ranges) obtained by dividing the infrared light wavelength range is two or more.

The above filter is a filter having a transmittance that reduces to zero a difference between an intensity of light which is on a short wavelength side and forms an image of the aliment mark AM2 sensed by the image sensor 34, and that of light which is on a long wavelength side and forms an image of the alignment mark AM2 sensed by the image sensor 34. However, the above filter is not limited to this, and the intensity difference is not zero in fact and may be within a predetermined value which does not influence measurement accuracy. For example, if the intensity difference between the intensity of light which is on the shorter wavelength side and that of light which is on the long wavelength side is within 15%, effects of broad (broad band) can be obtained without influencing the measurement accuracy. Thus, a filter having a transmittance for setting the intensity difference between the intensity of light which is on the shorter wavelength side and that of light which is on the long wavelength side within the predetermined value is also an effective technique.

A detection process by the substrate alignment detection system 116 in the exposure apparatus 1 will be described with reference to FIG. 15. The control unit 117 systematically controls each unit of the exposure apparatus 1 and, especially, each unit of the substrate alignment detection system 116 to perform this detection process. Note that when the process of the substrate 103 to be processed is the same as that in which the alignment mark AM2 is previously detected, the correspondence between the process of the substrate 103 and the filter is stored in a storage unit such as the memory of the control unit 117. Also, although the substrate alignment detection system 116 has, as operation modes, a detection mode in which it detects the position of the alignment mark AM2, and a preparation mode in which it makes preparations to detect the position of the alignment mark AM2, the preparation mode will be described in detail herein. Note that the detection mode includes steps S1502, S1503, and S1516, and the preparation mode includes steps S1504 to S1514.

In step S1502, it is determined whether the process of the substrate 103 to be processed is the same as that in which the alignment mark AM2 is previously detected. If the process of the substrate 103 to be processed is the same as that in which the alignment mark AM2 is previously detected, the process advances to step S1503. However, if the process of the substrate 103 to be processed is different from that in which the alignment mark AM2 is previously detected, the process advances to step S1504.

In step S1503, a filter to be placed in the optical path of the substrate alignment detection system 116 is selected based on the correspondence between the process of the substrate 103 and the filter, which is stored in the storage unit.

In step S1504, the wavelength range of infrared rays used to detect the alignment mark AM2 formed on the back surface of the substrate 103 is determined. More specifically, a wavelength range (for example, the wavelength range of 1,000 nm to 1,200 nm) wide enough to obtain a detection signal having sufficiently reduced interference fringes, as shown in FIG. 7B, is determined.

In step S1506, the wavelength range determined in step S1504 is divided into a plurality of divided wavelength ranges to detect the alignment mark AM2 using light in each divided wavelength range. More specifically, a filter having a transmittance of nearly 100% in each divided wavelength range is placed in the optical path of the substrate alignment detection system 116 to detect the alignment mark AM2. Upon this operation, the detection of the alignment mark AM2 is repeated a number of times equal to the number of divided wavelength ranges.

In step S1508, the intensity of light which forms an image of the alignment mark AM2 sensed by the image sensor 34 is calculated for each divided wavelength range, based on the detection result obtained in step S1506. When, for example, the wavelength range of 1,000 nm to 1,200 nm is divided into the wavelength range of 1,000 nm to 1,100 nm and the wavelength range of 1,100 nm to 1,200 nm, the intensity in the wavelength range of 1,000 nm to 1,100 nm and that in the wavelength range of 1,100 nm to 1,200 nm are calculated. This means that the intensity of light which forms an image of the alignment mark AM2 sensed by the image sensor 34 is calculated a number of times equal to the number of divided wavelength ranges.

In step S1510, the intensity ratio in the wavelength range determined in step S1504 is calculated based on the calculation result obtained in step S1508. In this case, the ratio (intensity ratio) between the intensity in the wavelength range of 1,000 nm to 1,100 nm and that in the wavelength range of 1,100 nm to 1,200 nm is assumed to be 10:1.

In step S1512, a filter to be placed in the optical path of the substrate alignment detection system 116 is selected from the plurality of filters arranged on the wavelength filter plate 22. More specifically, a filter having a transmittance that reduces the difference between the intensity of light which is on the short wavelength side and forms an image of the alignment mark AM2 sensed by the image sensor 34, and that of light which is on the long wavelength side and forms an image of the alignment mark AM2 sensed by the image sensor 34 is selected based on the intensity ratio calculated in step S1510. In this case, a filter having a transmittance for light in the wavelength range of 1,000 nm to 1,100 nm and that for light in the wavelength range of 1,100 nm to 1,200 nm at a ratio of 1:10 is selected. However, if a filter having such a transmittance is not arranged on the wavelength filter plate 22, a filter having a transmittance ratio closest to 1:10 is selected from the plurality of filters arranged on the wavelength filter plate 22.

In step S1514, the correspondence between the process of the substrate 103 and the filter selected in step S1512 is stored in a storage unit such as the memory of the control unit 117.

In step S1516, the filter selected in step S1503 or S1512 is placed in the optical path of the substrate alignment detection system 116 to detect the alignment mark AM2 formed on the back surface of the substrate 103.

Upon the detection process by the substrate alignment detection system 116 according to this embodiment, a detection signal in which the influence of interference fringes is reduced can be obtained, thus making it possible to accurately detect the alignment mark AM2 (its position) formed on the back surface of the substrate 103.

An exposure process by the exposure apparatus 1 will be described. Light emitted by a light source illuminates the reticle 101 through the illumination optical system 105. The light which bears the information of the pattern of the reticle 101 upon passing through the reticle 101 forms an image on the substrate 103 through the projection optical system 106. At this time, the substrate 103 is accurately positioned based on the detection result obtained by the substrate alignment detection system 116, as described above. Hence, the exposure apparatus 1 can provide a high-quality device (for example, a semiconductor integrated circuit device or a liquid crystal display device) with a high throughput and good economic efficiency. Note that the device is fabricated through a step of exposing a substrate (for example, a wafer or a glass plate) coated with a photoresist (photosensitive agent) using the exposure apparatus 1, a step of developing the exposed substrate, and subsequent known steps.

Although an alignment mark formed on the back surface of a substrate is detected using infrared light in this embodiment, the present invention is also applicable when an alignment mark formed on the front surface of a substrate is detected using visible light. Also, although a substrate alignment detection system has been described in this embodiment, the present invention is also applicable to other detection systems such as a reticle alignment detection system. Moreover, the present invention is applicable not only to an off-axis detection system but also to a TTL-AA detection system.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-123586 filed on Jun. 1, 2011, which is hereby incorporated by reference herein in its entirety.

What is claimed is:

1. A detection apparatus which detects an object to be detected, the apparatus comprising:

an illumination system configured to illuminate the object with light containing a first wavelength range and a second wavelength range different from the first wavelength range;

a detector configured to detect light from the object illuminated by the illumination system; and an optical member configured to set a transmittance for light in the first wavelength range and a transmittance for light in the second wavelength range to be different from each other, thereby reducing a difference between an intensity value of the light which has the first wavelength range and is detected by the detector and an intensity value of the light which has the second wavelength range and is detected by the detector, wherein the detection apparatus has, as operation modes, a detection mode in which the detection apparatus detects the object, and a preparation mode in which the detection apparatus makes preparations to detect the object, in the preparation mode, the illumination system illuminates the object with light in each of a plurality of divided wavelength ranges obtained by dividing a wavelength range including the first wavelength range and the second wavelength range, and the detector detects the light in each of the plurality of divided wavelength ranges from the object, the optical member includes a plurality of optical elements which have different transmittances and are exchangeably placed in an optical path of the light, and the detection apparatus further comprises a control unit configured to obtain an intensity ratio in the wavelength range from an intensity value of the light in each of the plurality of divided wavelength ranges detected by the detector, select an optical element, which reduces the difference, from the plurality of optical elements based on the intensity ratio, and place the selected optical element in the optical path in the detection mode.

2. The apparatus according to claim 1, wherein the control unit selects an optical element, which has a transmittance that reduces the difference to zero, from the plurality of optical elements based on the intensity ratio, and places the selected optical element in the optical path in the detection mode.

3. The apparatus according to claim 2, wherein the control unit includes a storage unit configured to store a correspondence between the intensity ratio and the optical element having the transmittance that reduces the difference to zero, selects the optical element from the plurality of optical elements based on the correspondence stored in the storage unit, and places the selected optical element in the optical path in the detection mode.

4. An exposure apparatus comprising:

a projection optical system configured to project a pattern of a reticle onto a substrate;

a stage configured to hold the substrate;

a detection apparatus configured to detect, as an object to be detected, a mark formed on the substrate; and a control unit configured to control a position of the stage based on the detection result obtained by the detection apparatus;

wherein the detection apparatus includes:

an illumination system configured to illuminate the object with light containing a first wavelength range and a second wavelength range different from the first wavelength range;

a detector configured to detect light from the object illuminated by the illumination system; and an optical member configured to set a transmittance for light in the first wavelength range and a transmittance for light in the second wavelength range to be different from each other, thereby reducing a difference between an intensity value of the light which has the first wavelength range and is detected by the detector and an intensity value of the light which has the second wavelength range and is detected by the detector, the detection apparatus has, as operation modes, a detection mode in which the detection apparatus detects the object, and a preparation mode in which the detection apparatus makes preparations to detect the object, in the preparation mode, the illumination system illuminates the object with light in each of a plurality of divided wavelength ranges obtained by dividing a wavelength range including the first wavelength range and the second wavelength range, and the detector detects the light in each of the plurality of divided wavelength ranges from the object, the optical member includes a plurality of optical elements which have different transmittances and are exchangeably placed in an optical path of the light, and the detection apparatus further comprises a control unit configured to obtain an intensity ratio in the wavelength range from an intensity value of the light in each of the plurality of divided wavelength ranges detected by the detector, select an optical element, which reduces the difference, from the plurality of optical elements based on the intensity ratio, and place the selected optical element in the optical path in the detection mode.

5. A device fabrication method comprising steps of:

exposing a substrate using an exposure apparatus; and performing a development process for the substrate exposed, wherein the exposure apparatus includes:

a projection optical system configured to project a pattern of a reticle onto the substrate;

a stage configured to hold the substrate;

a detection apparatus configured to detect a mark formed on the substrate; and a control unit configured to control a position of the stage based on the detection result obtained by the detection apparatus, wherein the detection apparatus includes:

an illumination system configured to illuminate the mark with light containing a first wavelength range and a second wavelength range different from the first wavelength range;

a detector configured to detect light from the mark illuminated by the illumination system; and an optical member configured to set a transmittance for light in the first wavelength range and a transmittance for light in the second wavelength range to be different from each other, thereby reducing a difference between an intensity value of the light which has the first wavelength range and is detected by the detector and an intensity value of the light which has the second wavelength range and is detected by the detector, the detection apparatus has, as operation modes, a detection mode in which the detection apparatus detects the mark, and a preparation mode in which the detection apparatus makes preparations to detect the mark, in the preparation mode, the illumination system illuminates the mark with light in each of a plurality of divided wavelength ranges obtained by dividing a wavelength range including the first wavelength range and the second wavelength range, and the detector detects the light in each of the plurality of divided wavelength ranges from the mark, the optical member includes a plurality of optical elements which have different transmittances and are exchangeably placed in an optical path of the light, and the detection apparatus further comprises a control unit configured to obtain an intensity ratio in the wavelength range from an intensity value of the light in each of the plurality of divided wavelength ranges detected by the detector, select an optical element, which reduces the difference, from the plurality of optical elements based on the intensity ratio, and place the selected optical element in the optical path in the detection mode.

6. A detection apparatus which detects an object to be detected formed on a back surface of a substrate, using infrared light, the apparatus comprising:

an illumination system configured to illuminate the object with infrared light containing a first wavelength range and a second wavelength range longer than the first wavelength range;

an image sensor configured to detect the infrared light from the object illuminated by the illumination system, the image sensor has a sensitivity to visible light, the infrared light in the first wavelength range and the infrared light in the second wavelength range, the sensitivity to the infrared light in the second wavelength range is smaller than the sensitivity to the infrared light in the first wavelength range; and an optical unit configured to reduce an intensity difference between an intensity value of the infrared light in the first wavelength range detected by the image sensor and an intensity value of the infrared light in the second wavelength range detected by the image sensor, which is generated by a difference of the sensitivity of the image sensor, wherein the optical unit is an optical member configured to set a transmittance for the infrared light in the first wavelength range and a transmittance for the infrared light in the second wavelength range to be different from each other, thereby reducing the intensity difference or a light source apparatus configured to set an amount of the infrared light in the first wavelength range which enters the illumination system and an amount of the infrared light in the second wavelength range which enters the illumination system to be different from each other, thereby reducing the intensity difference.

7. The apparatus according to claim 6, wherein the transmittance for the infrared light in the second wavelength range of the optical member is higher than the transmittance for the infrared light in the first wavelength range of the optical member.

8. The apparatus according to claim 6, wherein the optical member has a transmittance that reduces the intensity difference to zero.

9. The apparatus according to claim 6, wherein the detection apparatus has, as operation modes, a detection mode in which the detection apparatus detects the object, and a preparation mode in which the detection apparatus makes preparations to detect the object, in the preparation mode, the illumination system illuminates the object with light in each of a plurality of divided wavelength ranges obtained by dividing a wavelength range including the first wavelength range and the second wavelength range, and the image sensor detects the light in each of the plurality of divided wavelength ranges from the object, the optical member includes a plurality of optical elements which have different transmittances and are exchangeably placed in an optical path of the light, and the detection apparatus further comprises a control unit configured to obtain an intensity ratio in the wavelength range from an intensity value of the light in each of the plurality of divided wavelength ranges detected by the image sensor, select an optical element, which reduce the intensity difference, from the plurality of optical elements based on the intensity ratio, and place the selected optical element in the optical path in the detection mode.

10. The apparatus according to claim 9, wherein the control unit selects an optical element, which has a transmittance that reduces the intensity difference to zero, from the plurality of optical elements based on the intensity ratio, and places the selected optical element in the optical path in the detection mode.

11. The apparatus according to claim 10, wherein the control unit includes a storage unit configured to store a correspondence between the intensity ratio and the optical element having the transmittance that reduces the intensity difference to zero, selects the optical element from the plurality of optical elements based on the correspondence stored in the storage unit, and places the selected optical element in the optical path in the detection mode.

12. The apparatus according to claim 6, wherein the optical member is placed in an optical path of the illumination system.

13. The apparatus according to claim 6, further comprising an imaging system configured to form an image of the object using light from the object, wherein the optical member is placed in an optical path of the imaging system.

14. The apparatus according to claim 6, wherein the optical member has a transmittance that reduces the intensity difference to a value less than or equal to a predetermined value.

15. An exposure apparatus comprising:

a projection optical system configured to project a pattern of a reticle onto a substrate;

a stage configured to hold the substrate;

a detection apparatus configured to detect an object to be detected formed on a back surface of a substrate, using infrared light; and a control unit configured to control a position of the stage based on the detection result obtained by the detection apparatus;

wherein the detection apparatus includes:

an illumination system configured to illuminate the object with infrared light containing a first wavelength range and a second wavelength range longer than the first wavelength range;

an image sensor configured to detect the infrared light from the object illuminated by the illumination system, the image sensor has a sensitivity to visible light, the infrared light in the first wavelength range and the infrared light in the second wavelength range, the sensitivity to the infrared light in the second wavelength range is smaller than the sensitivity to the infrared light in the first wavelength range; and an optical unit configured to reduce an intensity difference between an intensity value of the infrared light in the first wavelength range detected by the image sensor and an intensity value of the infrared light in the second wavelength range detected by the image sensor, which is generated by a difference of the sensitivity of the image sensor, wherein the optical unit is an optical member configured to set a transmittance for the infrared light in the first wavelength range and a transmittance for the infrared light in the second wavelength range to be different from each other, thereby reducing the intensity difference or a light source apparatus configured to set an amount of the infrared light in the first wavelength range which enters the illumination system and an amount of the infrared light in the second wavelength range which enters the illumination system to be different from each other, thereby reducing the intensity difference.

16. A device fabrication method comprising steps of:

exposing a substrate using an exposure apparatus; and performing a development process for the substrate exposed, wherein the exposure apparatus includes:

a projection optical system configured to project a pattern of a reticle onto a substrate;

a stage configured to hold the substrate;

a detection apparatus configured to detect an object to be detected formed on a back surface of a substrate, using infrared light; and a control unit configured to control a position of the stage based on the detection result obtained by the detection apparatus, the detection apparatus includes:

an illumination system configured to illuminate the object with infrared light containing a first wavelength range and a second wavelength range longer than the first wavelength range;

an image sensor configured to detect the infrared light from the object illuminated by the illumination system, the image sensor has a sensitivity to visible light, the infrared light in the first wavelength range and the infrared light in the second wavelength range, the sensitivity to the infrared light in the second wavelength range is smaller than the sensitivity to the infrared light in the first wavelength range; and an optical unit configured to reduce an intensity difference between an intensity value of the infrared light in the first wavelength range detected by the image sensor and an intensity value of the infrared light in the second wavelength range detected by the image sensor, which is generated by a difference of the sensitivity of the image sensor, wherein the optical unit is an optical member configured to set a transmittance for the infrared light in the first wavelength range and a transmittance for the infrared light in the second wavelength range to be different from each other, thereby reducing the intensity difference or a light source apparatus configured to set an amount of the infrared light in the first wavelength range which enters the illumination system and an amount of the infrared light in the second wavelength range which enters the illumination system to be different from each other, thereby reducing the intensity difference.

* * * * *